United States Patent
Galatenko et al.

(10) Patent No.: US 7,103,865 B2
(45) Date of Patent: Sep. 5, 2006

(54) PROCESS AND APPARATUS FOR PLACEMENT OF MEGACELLS IN ICS DESIGN

(75) Inventors: Alexei V. Galatenko, Moscow (RU); Valeriy B. Kudryavtsev, Moscow (RU); Elyar E. Gasanov, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 170 days.

(21) Appl. No.: 10/719,393

(22) Filed: Nov. 21, 2003

(65) Prior Publication Data

US 2005/0114813 A1    May 26, 2005

(51) Int. Cl.
G06F 9/45  (2006.01)
G06F 17/50 (2006.01)

(52) U.S. Cl. .............................. 716/10; 716/8; 716/11
(58) Field of Classification Search ............. 716/1–18; 395/500
See application file for complete search history.

(56) References Cited

U.S. PATENT DOCUMENTS

| | | | | |
|---|---|---|---|---|
| 4,630,219 A | * | 12/1986 | DiGiacomo et al. | 716/9 |
| 5,535,134 A | * | 7/1996 | Cohn et al. | 716/8 |
| 5,712,793 A | * | 1/1998 | Scepanovic et al. | 716/12 |
| 5,808,899 A | * | 9/1998 | Scepanovic et al. | 716/2 |
| 6,014,506 A | * | 1/2000 | Hossain et al. | 716/11 |
| 6,134,702 A | | 10/2000 | Scepanovic et al. | |
| 6,189,132 B1 | * | 2/2001 | Heng et al. | 716/11 |
| 6,292,929 B1 | | 9/2001 | Scepanovic et al. | |
| 6,415,425 B1 | * | 7/2002 | Chaudhary et al. | 716/9 |
| 6,637,016 B1 | * | 10/2003 | Gasanov et al. | 716/12 |
| 6,650,046 B1 | * | 11/2003 | Shirakawa et al. | 313/506 |
| 6,725,432 B1 | | 4/2004 | Chang et al. | |
| 6,748,574 B1 | | 6/2004 | Sasagawa et al. | |
| 2003/0163795 A1 | * | 8/2003 | Morgan et al. | 716/10 |
| 2003/0188274 A1 | * | 10/2003 | Gasanov et al. | 716/4 |
| 2004/0166864 A1 | | 8/2004 | Hill et al. | |
| 2005/0038728 A1 | | 2/2005 | La Mura | |
| 2005/0091625 A1 | * | 4/2005 | Andreev et al. | 716/8 |

* cited by examiner

Primary Examiner—Vuthe Siek
Assistant Examiner—Nghia M. Doan
(74) Attorney, Agent, or Firm—Westman, Champlin & Kelly

(57) ABSTRACT

An IC layout containing megacells placed in violation of design rules is corrected to remove design rule violations while maintaining the original placement as near as practical. The sizes of at least some of the megacells are inflated. The megacells are placed and moved in a footprint of the circuit in a manner to reduce placement complexity. The placement of the megacells is permuted to reduce placement complexity. Additional movements are be applied to the permuted placement to further reduce placement complexity.

18 Claims, 3 Drawing Sheets

PROCESS AND APPARATUS FOR PLACEMENT OF MEGACELLS IN ICS DESIGN

FIELD OF THE INVENTION

This invention relates to integrated circuits (ICs), and particularly to placement of megacells during the design phase of manufacturing ICs.

BACKGROUND OF THE INVENTION

During the design phase of an integrated circuit, it is necessary to place cells within the bounds (footprint) of the semiconductor chip layout in accordance with certain design rules. The placement of cells takes into account routing of wires between the cells, pin placement, timing considerations, etc. Certain cells, called "megacells", occupy a considerably larger area than most cells. Examples of megacells include flip-flops, memories, etc.

When the cells are initially placed, the positions of certain cells, including certain megacells, are considered "fixed" due to design constraints. For example, it is common to fix the position of cells having pins coupled to an edge of the IC chip for connection to external devices.

During the design phase, wires are routed between cells. These wires form "blockages" where cells and megacells cannot be placed. Thus, if the position of a cell or megacell encroaches on a blockage, either the blockage or the cell (or megacell) must be moved. Ordinarily, movement of a blockage is a relatively complex task, because it usually involves movement of numerous other cells and megacells. On the other hand, it is a relatively simple matter to move ordinary cells to accommodate blockages. Therefore, it is common to move ordinary cells rather than blockages. But it is not an altogether easy task to move megacells to accommodate blockages.

Another problem encountered in megacell placement occurs where plural megacells overlap. The size of megacells usually makes it difficult to move megacells after placement of other cells. Moreover, movement of fixed megacells, including flipping and rotation, might adversely affect timing considerations to pins of the megacell, and might adversely affect the space available for routing wires and subsequent cell placement.

Consequently, there is a need for a technique to place megacells to the footprint of an IC chip such that the placement of all megacells is "legal". As used herein, megacell placement is considered legal if no two megacells intersect, if no megacell occupies area covered by blockages, if fixed megacells are not moved, rotated or flipped, and if there is enough space between megacells to create a legal placement of the remaining cells and blockages.

SUMMARY OF THE INVENTION

The present invention is directed to legal placement of megacells, and particularly to correcting an initial design that violates design rules so that the corrected design satisfies the design rules while maintaining placement that is similar to the initial placement.

In one embodiment of the invention, megacells are in an initial integrated circuit layout that violates design rules. A size of each not-fixed megacell is inflated, and the inflated megacell is placed in a footprint of the chip to reduce placement complexity. Megacell placements are permuted to reduce placement complexity.

In some embodiments, the megacell size is inflated by identifying a distance between an edge on the megacell and each side of the chip. A distance between the centers of the megacell and each other not-fixed megacell is identified, and an inflation factor is applied to the sides of the megacell.

In other embodiments, the megacells are placed by placing all fixed megacells and blockages in the footprint. A list is generated of free rectangles in the footprint that do not contain megacells and blockages. Beginning with the largest not-fixed megacell, each not-fixed megacell is placed in a free rectangle that is large enough to receive the megacell. A transformation movement is then applied to the megacell if the movement reduces placement complexity.

In other embodiments, the permutation of megacell placements is performed by swapping positions of megacells of each pair of not-fixed megacells if the swapping reduces placement complexity, and then applying a transformation movement to each megacell if the movement reduces placement complexity.

In a second embodiment, a computer usable medium contains computer readable program code that causes a computer to carry out the process.

DETAILED DESCRIPTION OF THE PREFERRED EMBODIMENTS

In preferred embodiments, the process is carried out in a computer under the control of a computer readable program having code that controls the computer to perform steps of the process. For purposes of explanation, it is assumed that the input layout includes an illegal megacell placement. It is also assumed that the input placement satisfies all requirements other than being legal. Therefore, the goal of the present invention is to obtain a legal placement of megacells that is as similar to the input placement as possible.

For purposes of the present invention, a placement is considered legal if all of the following conditions are satisfied: (1) no megacells intersect, (2) no megacells occupy areas covered by blockages, (3) fixed megacells are not moved, rotated or flipped, and (4) there is enough space between megacells to create a legal placement of the entire IC chip. If the input placement is legal, the process ends. Otherwise, process is carried out to place megacells to a legal placement satisfying the above requirements, with the final placement as similar to the initial placement as possible.

Figure 1:
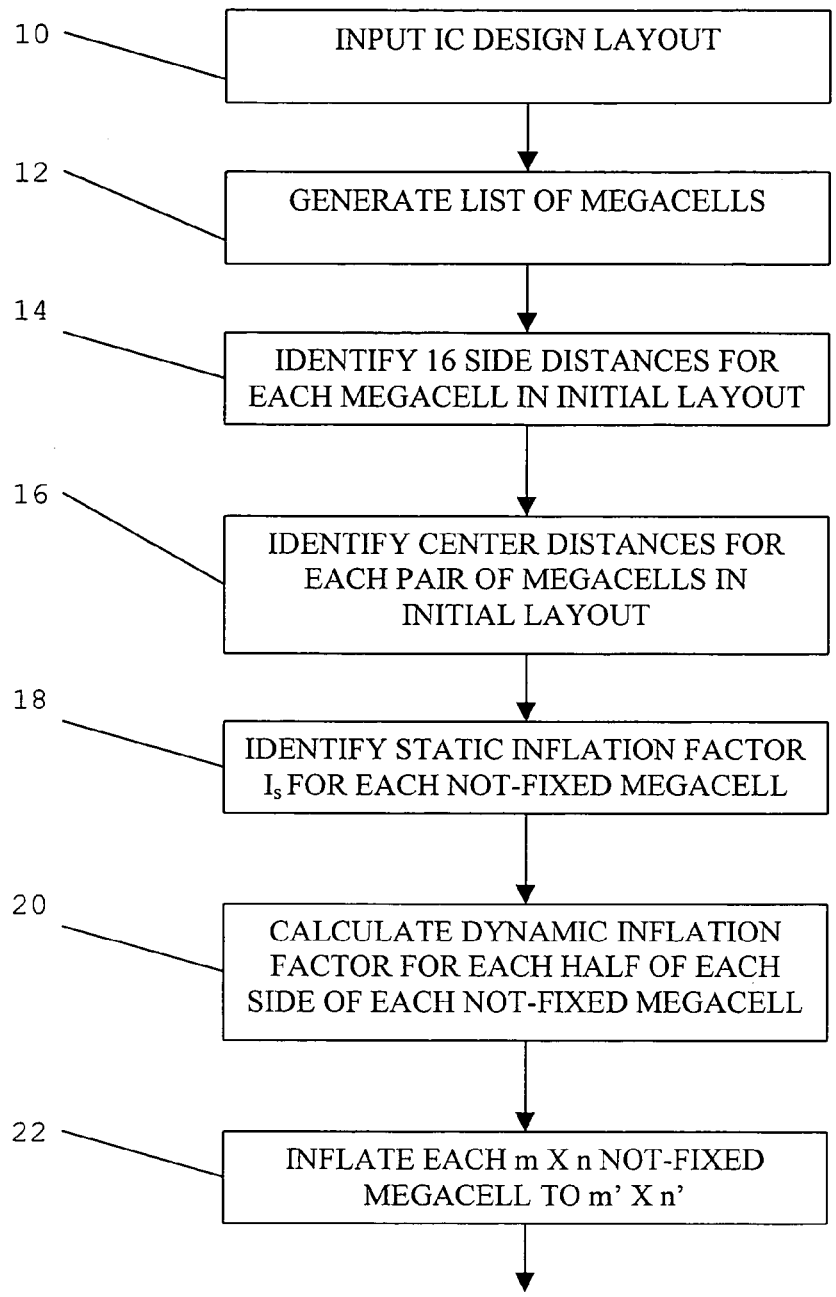
FIGS. 1–3, taken together, is a flowchart of a process of megacell placement according to the present invention.
Figure 2:
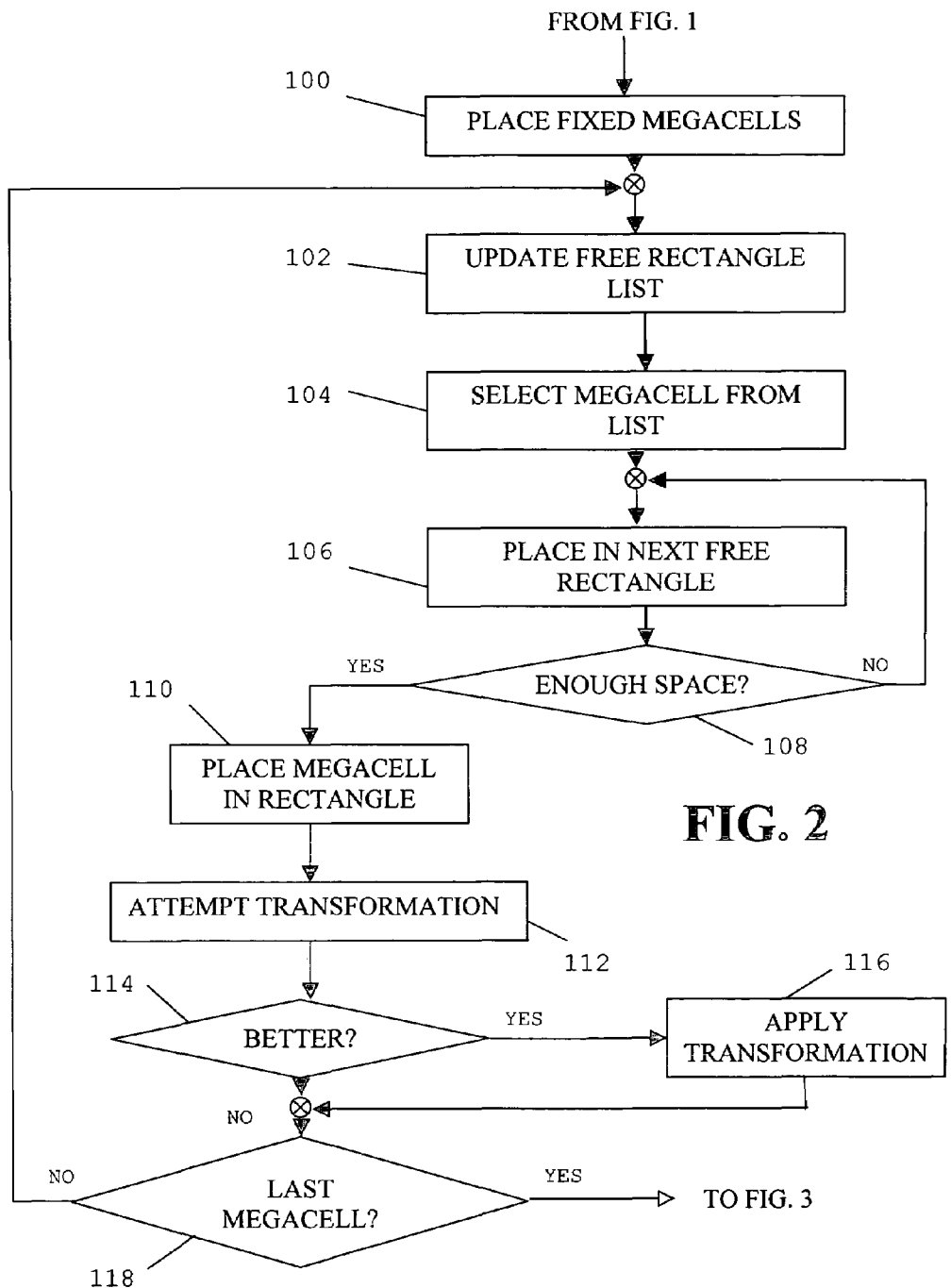
Figure 3:
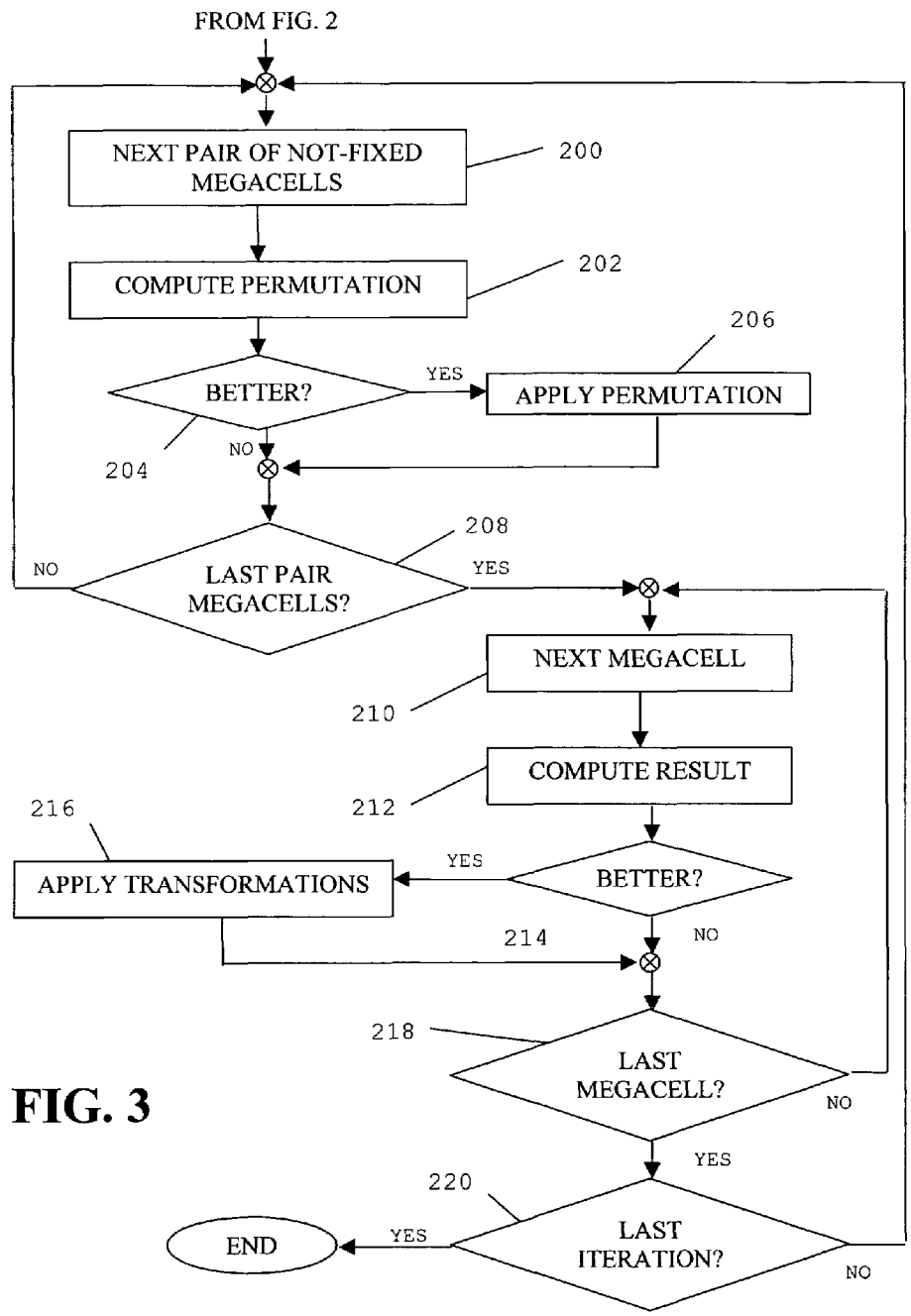

The process consists of three primary steps: 1) parameter initialization, 2) initial placement, and 3) local improvements. These steps are shown in FIGS. 1–3, respectively.

1. Algorithm Parameters Initialization—FIG. 1

At step 10, the initial layout of the IC chip is input to the system, and at step 12 a list of megacells is generated. Blockages are treated as fixed megacells. The list commences with the fixed megacells, including blockages, arranged in arbitrary order. The not-fixed megacells are then arranged in order by area, commencing with the largest. There are two groups of megacell parameters: distance parameters and inflation parameters.

The distance parameters are side distance parameters and megacell center distance parameters. At step 14, the side distance parameters are identified for each megacell in the design based on the initial placement. The side distance parameters are the distances, in the initial placement, from each megacell corner to each chip edge in Manhattan metrics. For each megacell $M_i$, there are sixteen side distance parameters $Ds_{i1}, \ldots, Ds_{i16}$. At step 16, the megacell center distance parameters are identified for each pair of megacells ($M_i$, $M_j$) in the initial placement. More particularly, a center distance parameter $Dm_{ij}$ equal to the distance between megacell centers is identified in the input placement in Manhattan metrics.

Inflation parameters are calculated for each megacell that is not fixed in the initial design. At step 18, a static parameter $I_S$ is identified for all not-fixed megacells. The static inflation parameter, which may be a pre-established inflation factor, will simply inflate the size of each not-fixed megacell by a design amount. At step 20, a dynamic inflation parameter is calculated for each not-fixed megacell. More particularly, for each half $p_i$ of each not-fixed megacell $M_i$, the number of pins $np_i$ in the half is identified, and a dynamic inflation parameter for the part $p_i$ is set equal to $np_i*I_{dyn}$, where $I_{dyn}$ is a pre-selected dynamic inflation coefficient. The procedure is applied to four overlapping halves on the not-fixed megacell: left and right halves of the megacell, and the upper and lower halves of the megacell, to derive the dynamic inflation parameter for the two orthogonal directions of the megacell.

After the inflation parameters are established, each not-fixed megacell is inflated at step 22. More particularly, if the megacell size is equal to m×n, new sizes are $m'=m+2*I_s+(np_{left}+np_{right})*I_{dyn}$ and $n'=n+2I_S+(np_{upper}+np_{lower})*I_{dyn}$, where m and m' are the respective dimensions of the horizontal sides, n and n' are the respective dimensions of the vertical sides, and $np_{left}*I_{dym}$, $np_{right}*I_{dym}$, $np_{upper}*I_{dym}$ and $np_{lower}*I_{dym}$ are the dynamic inflation parameters for the left, right, upper and lower halves of the megacell. The inflation thus forms a larger megacell with dimensions m'×n' to provide enough space for wires. The process then continues to FIG. 2.

2. Initial Placement—FIG. 2

At step 100, the fixed megacells are placed to their positions. This step commences with a rectangle identifying the footprint of the IC chip and initially consisting entirely of free space. The fixed megacells, including blockages, are placed in the footprint. As a result of step 100, some of the space of the footprint is occupied by fixed megacells and blockages. At step 102, a list of maximal free rectangles is updated. The number of maximal free rectangles grows at a rate not greater than a linear function of the placement of megacells.

At step 104, a not-fixed megacell is selected from the list. The megacells are selected in the same order as they appear in the list. Since the not-fixed megacells are in order by size in the list, the largest not-fixed megacell is placed first.

At step 106 the megacell is placed at the next rectangle in the list of maximal free rectangles. If, at step 108, the megacell will fit in the selected free rectangle, at step 110 it is initially placed to a corner of the rectangle, such as the upper left corner. However, if at step 108 there is not enough space in the rectangle to accommodate the megacell, the process loops back to step 106 to select the next rectangle.

After the not-fixed megacell is placed, transformations are performed at steps 112–116 to improve placement complex ity. More particularly, the placement complexity is represented by the function:

$$\sum_{\{megacellsplaced\}} CM_i + CS_i,$$

where $$CM_i = \sum_{i \ne j} |Dm_{ij} - Cm_{ij}|/(2 \cdot M_{norm}),$$

$CS_i = \Sigma_{k=i}^{16} |Ds_{ik} - Cs_{ik}|/S_{norm}$, $Cm_{ij}$ is the current distance between megacells i and j in Manhattan metrics, $Cs_{ik}$ is the corresponding distance between the megacell corner and chip side in Manhattan metrics, and $M_{norm}$ and $S_{norm}$ are norming coefficients.

There are three types of transformations: shifts, rotations, and flips. Shifts are iteratively applied vertically and/or horizontally. The initial iteration shifts the megacell by a distance equal to one-half of the corresponding dimension of the free rectangle, less the minimal size of the megacell placed. The shift distance is divided by two for each subsequent iteration.

Transformation by rotation is in fixed angular rotations of 90°, 180°, and 270°. A transformation by flipping creates a mirror image of the megacell against the horizontal or vertical axis.

A transformation is performed if it reduces placement complexity. Thus, for each transformation type, at step 112 the transformation type and amount is calculated. For example, if a horizontal shift is attempted, the first iteration will shift the megacell to the right (assuming it is initially in the upper left corner) by a distance equal to one-half of the horizontal dimension of the free rectangle less the minimal size of the megacell. If the shift results in improved placement complexity, a second shift is attempted, also to the right, by one-half the distance (¼ of the dimension of the free rectangle less ½ the size of the megacell). If the second shift did not improve placement complexity, a third shift from the ending point of the second shift is attempted to the left by one-quarter the distance (e.g., to a point ⅝ the dimension of the free rectangle less ¼ the size of the megacell). The process continues until a position for the megacell is selected.

The transformation process continues through all three types until an optimal transformation is achieved at step 112 for all transformation types. If at step 114 the result is a better placement, the transformation is applied at step 116. If no more applicable transformations remain, the current complexity value is memorized and the process continues to step 118. If at step 118 the megacell placed by the process of FIG. 2 was not the last not-fixed megacell, the process loops back to step 102 to update the free rectangle list and place the next not-fixed megacell.

After all not-fixed megacells are placed and the maximal free rectangles are covered, the minimal complexity value is selected, and the corresponding placement is accepted. The initial placement is completed and the process continues from step 118 to FIG. 3. In the worst case the placement complexity is $N^3$, where N is the number of not-fixed megacells.

3. Local Improvements—FIG. 3

FIG. 3 is a flowchart of a process for local improvements of the placement of megacells. In preferred embodiments, the process is repeated for $N_{ij}$ iterations, with each iteration comprising two stages: permutations and movements. In this procedure, only not-fixed megacells are considered.

Permutations are performed by trying to swap pairs of megacells. At step 200, a pair of not-fixed megacells is selected. If there is enough free space in the rectangle to perform swapping, and if complexity is reduced by swapping, the permutation is accepted. If no permutation is acceptable, the process of FIG. 3 is finished. If a permutation is accepted, movements in the form of shifts, rotations and flips are applied to the not-fixed megacells inside the free rectangle. The movement process is the same as the transformation process of FIG. 2, and is iteratively applied to each not-fixed megacell in the same sequence as they appear in the list as long as complexity is improved. When all megacells are transformed, the placement is finished.

At step 200, a pair of not-fixed megacells within the rectangle is selected, and their positions are swapped. At step 202, the result of the permutation is computed and compared for better results at step 206. For example, consider not-fixed megacells A, B and C, initially positioned as A/B/C. The position of megacell A is swapped with megacell B, so placement A/B/C becomes B/A/C. If the placement complexity is better, the new position is applied at step 206. At step 208, if a pair of megacells has not been considered, the process loops back to step 200 where another pair of megacells, such as megacells A/C is considered. As a result of the second iteration, B/A/C might become B/C/A. The process continues until all pairs of megacells have been considered with no further improvement in complexity. Thus in the example, the B/C pair will be considered, and pairs previously considered will be re-considered. For example, the positions of megacells A and B might again be swapped if the A/C swap allows improved complexity by swapping B/A. Thus, B/C/A might become A/C/B. When the permutation process of steps 200–208 results in no further improvement, the process continues to step 210.

At step 210, the not-fixed megacell that is first in the list (for example megacell A) is selected, and at steps 212, 214 and 216 transformations are proposed and performed. Steps 212, 214 and 216 are the same as steps 112, 114 and 116 in FIG. 2. Thus, the megacell is shifted, rotated and/or flipped as previously described. At step 218, if the megacell was not the last megacell in the list, the process loops back to step 200 to consider the next not-fixed megacell. Thus, the megacells are transformed in the same order that they appear in the list. After all not-fixed megacells have been considered at step 218, the process continues to step 220.

Step 220 causes the process to loops back to step 20 if the last iteration has not been completed. Thus, the permutations and transformations are re-computed in the manner previously described. The decision at step 220 is based on design parameters. For example, the number of iterations may be pre-selected, and a counter simply ends the process when the maximum number of iterations is reached. Alternatively, the amount of improvement of the complexity might be recorded for each iteration of the process, and the process ended when the improvement between successive iterations is less than some predetermined amount.

Although the present invention has been described with reference to preferred embodiments, workers skilled in the art will recognize that changes may be made in form and detail without departing from the spirit and scope of the invention.

What is claimed is:

1. A process of positioning megacells that are included in an initial integrated circuit layout, the circuit layout having sides defining sides of a chip, the process comprising steps of:
    inflating a size of at least some of the megacells, wherein the step of inflating the size of megacells comprises, for each megacell of a first type: identifying a distance between an edge on the megacell and each side of the chip, identifying a distance between a center of the megacell and a center of another megacell of the first type, and applying an inflation factor to the sides of the megacell;
    placing the megacells in a footprint of the circuit; and
    permuting megacell placements.

2. The process of claim 1, wherein the inflation factor is calculated by:
    identifying a number of pins in each half of the megacell in each of two orthogonal directions, and
    for each direction, at least in part basing the inflation factor for sides of the megacell in the respective direction on the number of pins in both halves of the megacell.

3. The process of claim 1, wherein the megacell has dimensions of m×n, and the inflation factor in the m dimension is calculated based on $I_{dyn} \cdot (np_{left} + np_{right})$ and the inflation factor in the n dimension is calculated based on $I_{dyn} \cdot (np_{upper} + np_{lower})$, where $I_{dyn}$ is an inflation coefficient, $np_{left}$ and $np_{right}$ are a number of pins in respective halves of the megacell divided along the m dimension, and $np_{upper}$ and $np_{lower}$ are a number of pins in respective halves of the megacell divided along the n dimension.

4. The process of claim 1, wherein the placement of the megacells comprises:
    placing all fixed megacells and blockages in the footprint,
    generating a list of free rectangles in the footprint that do not contain megacells and blockages,
    for each not-fixed megacell starting with a not-fixed megacell selected on the basis of size, placing the megacell in a free rectangle that is large enough to receive the megacell, and
    applying a transformation movement to the megacell if the movement reduces placement complexity.

5. The process of claim 4, wherein the transformation movement is selected from the group consisting of shifting, rotating and flipping.

6. The process of claim 4, wherein the step of placing not-fixed megacells starts with the largest not-fixed megacell.

7. The process of claim 1, wherein the permutation of megacell placements comprises:
    swapping positions of megacells of each pair of not-fixed megacells if the swapping reduces placement complexity, and
    applying a transformation movement to each megacell if the movement reduces placement complexity.

8. The process of claim 7, wherein the transformation movement is selected from the group consisting of shifting, rotating and flipping.

9. The process of claim 7, wherein the swapping and application of transformation movement is iteratively performed.

10. A computer usable medium having a computer readable program embodied therein for addressing data to position megacells that are included in an initial integrated circuit layout, the circuit layout having sides defining sides of a chip, the computer readable program comprising:
  computer readable code for causing the computer to inflate a size of at least some of the megacells; wherein inflation the size of megacells comprises, for each megacell of a first type: identifying a distance between an edge on the megacell and each side of the chip, identifying a distance between a center of the megacell and a center of another megacell of the first type, and applying an inflation factor to the sides of the megacell;
  computer readable code for causing the computer to place the megacells in a footprint of the circuit; and
  computer readable code for causing the computer to permute megacell placements.

11. The computer usable medium of claim 10, wherein the computer readable program further includes:
  computer readable code for causing the computer to identify a number of pins in each half of the megacell in each of two orthogonal directions, and
  computer readable code for causing the computer to calculate the inflation factor for a side of the megacell along one of the directions based at least in part on the number of pins in both respective halves of the megacell.

12. The computer usable medium of claim 10, wherein the megacell has dimensions of m×n, and the computer readable code applying an inflation factor calculates the inflation factor for the megacell in the m dimension based on $I_{dyn} \cdot (np_{left} + np_{right})$ and calculates the inflation factor in the n dimension based on $I_{dyn} \cdot (np_{upper} + np_{lower})$, where $I_{dyn}$ is an inflation coefficient, $np_{left}$ and $np_{right}$ are a number of pins in respective halves of the megacell divided along the m dimension, and $np_{upper}$ and $np_{lower}$ are a number of pins in respective halves of the megacell divided along the n dimension.

13. The computer usable medium of claim 10, wherein the computer readable code for causing the computer to place the megacells comprises:
  computer readable code for causing the computer to place all fixed megacells and blockages in the footprint,
  computer readable code for causing the computer to generate a list of free rectangles in the footprint that do not contain megacells and blockages,
  computer readable code for causing the computer to place each not-fixed megacell in a free rectangle that is large enough to receive the megacell, and
  computer readable code for causing the computer to apply a transformation movement to the megacell if the movement reduces placement complexity.

14. The computer usable medium of claim 13, wherein the transformation movement is selected from the group consisting of shifting, rotating and flipping.

15. The computer usable medium of claim 13, wherein the computer readable code for placing not-fixed megacells starts with the largest not-fixed megacell.

16. The computer usable medium of claim 10, wherein the computer readable code that causes the computer to permute megacell placements comprises:
  computer readable program code for causing the computer to swap positions of megacells of each pair of not-fixed megacells if the swapping reduces placement complexity, and
  computer readable program code for causing the computer to apply a transformation movement to each megacell if the movement reduces placement complexity.

17. The computer usable medium of claim 16, wherein the transformation movement is selected from the group consisting of shifting, rotating and flipping.

18. The computer usable medium of claim 16, wherein the swapping and application of transformation movement is iteratively performed.

* * * * *